(12) United States Patent
Hwang

(10) Patent No.: US 12,334,921 B2
(45) Date of Patent: Jun. 17, 2025

(54) HIGH SPEED DUAL-TAIL LATCH WITH POWER GATING

(71) Applicant: Micron Technology, Inc., Boise, ID (US)

(72) Inventor: Jinha Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 18/507,314

(22) Filed: Nov. 13, 2023

(65) Prior Publication Data
US 2024/0291492 A1 Aug. 29, 2024

Related U.S. Application Data

(60) Provisional application No. 63/448,858, filed on Feb. 28, 2023.

(51) Int. Cl.
| | | |
|---|---|---|
| H03K 19/0185 | (2006.01) | |
| H03F 3/45 | (2006.01) | |
| H03K 3/012 | (2006.01) | |
| H03K 3/356 | (2006.01) | |

(52) U.S. Cl.
CPC . H03K 19/018528 (2013.01); H03F 3/45183 (2013.01); H03K 3/012 (2013.01); H03K 3/35613 (2013.01)

(58) Field of Classification Search
CPC ........... H03K 19/018528; H03K 3/012; H03K 3/35613; H03H 3/45183
See application file for complete search history.

(56) References Cited

U.S. PATENT DOCUMENTS

| | | | |
|---|---|---|---|
| 8,467,255 B2 | 6/2013 | Kim et al. | |
| 10,291,439 B1 | 5/2019 | Taylor et al. | |
| 10,447,290 B2* | 10/2019 | Ghosh | H03M 1/089 |
| 11,037,607 B2 | 6/2021 | Chong et al. | |
| 11,854,651 B2 | 12/2023 | Taylor | |
| 2017/0117031 A1* | 4/2017 | Lee | G11C 7/1084 |
| 2018/0183422 A1* | 6/2018 | Yasotharan | H03K 3/356139 |
| 2023/0008644 A1* | 1/2023 | Gu | H03K 5/249 |

OTHER PUBLICATIONS

Hajimiri et al., "Design Issues in Cross-Coupled Inverter Sense Amplifier," ISCAS '98. Proceedings of the 1998 IEEE International Symposium on Circuits and Systems (Cat. No. 98CH36187), Monterey, CA, USA, 1998, pp. 149-152 vol. 2, doi: 10.1109/ISCAS.1998.706863.
U.S. Appl. No. 18/506,208, filed Nov. 10, 2023, Jinha Hwang.

* cited by examiner

*Primary Examiner* — Sibin Chen
(74) *Attorney, Agent, or Firm* — Fletcher Yoder, P.C.

(57) ABSTRACT

A semiconductor device includes a first sensing stage configured to sense a voltage differential of a data signal and a reference signal and output a first amplified voltage differential, wherein the first amplified voltage differential includes a first voltage at a first output node and a second voltage at a second output node. The semiconductor device further includes a second sensing stage configured to sense the first amplified voltage differential and output a second amplified voltage differential, where the second amplified voltage differential includes a third voltage at a third output node and a fourth voltage at a fourth output node. A first power gating circuit is coupled to the third output node and a second power gating circuit is coupled to the fourth output node.

18 Claims, 3 Drawing Sheets

HIGH SPEED DUAL-TAIL LATCH WITH POWER GATING

CROSS-REFERENCE TO RELATED APPLICATIONS

This application claims priority to U.S. Provisional Application No. 63/448,858, filed Feb. 28, 2023, entitled "HIGH SPEED DUAL-TAIL LATCH WITH POWER GATING," the disclosure of which is incorporated by reference in its entirety for all purposes.

FIELD OF THE PRESENT DISCLOSURE

Embodiments of the present disclosure relate generally to the field of semiconductor devices. More specifically, embodiments of the present disclosure relate to dual-tail latches in a memory device.

DESCRIPTION OF RELATED ART

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Semiconductor devices (e.g., memory devices) may use a combination of one or more comparators or sensing stages and an output stage (e.g., a dual-tail latch or double-tail latch) to sense and latch signals without additional electronic components. The dual-tail latch may be implemented with n-type input transistors or p-type input transistors, allowing for sensing of different voltage levels within a wide common mode range. However, as performance demands increase on semiconductor devices, especially using low voltages in high-speed operations and applications where low leakage characteristics may be desired, the conventional dual-tail latch performance may be insufficient without making changes to the dual-tail latch. That is, in certain applications, usage of traditional dual-tail latch architectures with greater performance demands may result in distortion of the data eye, reduced rank margining tool (RMT) margin and/or difficulties in decision feedback equalization (DFE) training. As such, systems implementing an improved dual-tail latch may be desired.

Embodiments of the present disclosure may be directed to address one or more of the problems set forth above.

BRIEF DESCRIPTION OF DRAWINGS

Various aspects of this disclosure may be better understood upon reading the following detailed description and upon reference to the drawings in which.

DETAILED DESCRIPTION

Figure 1:
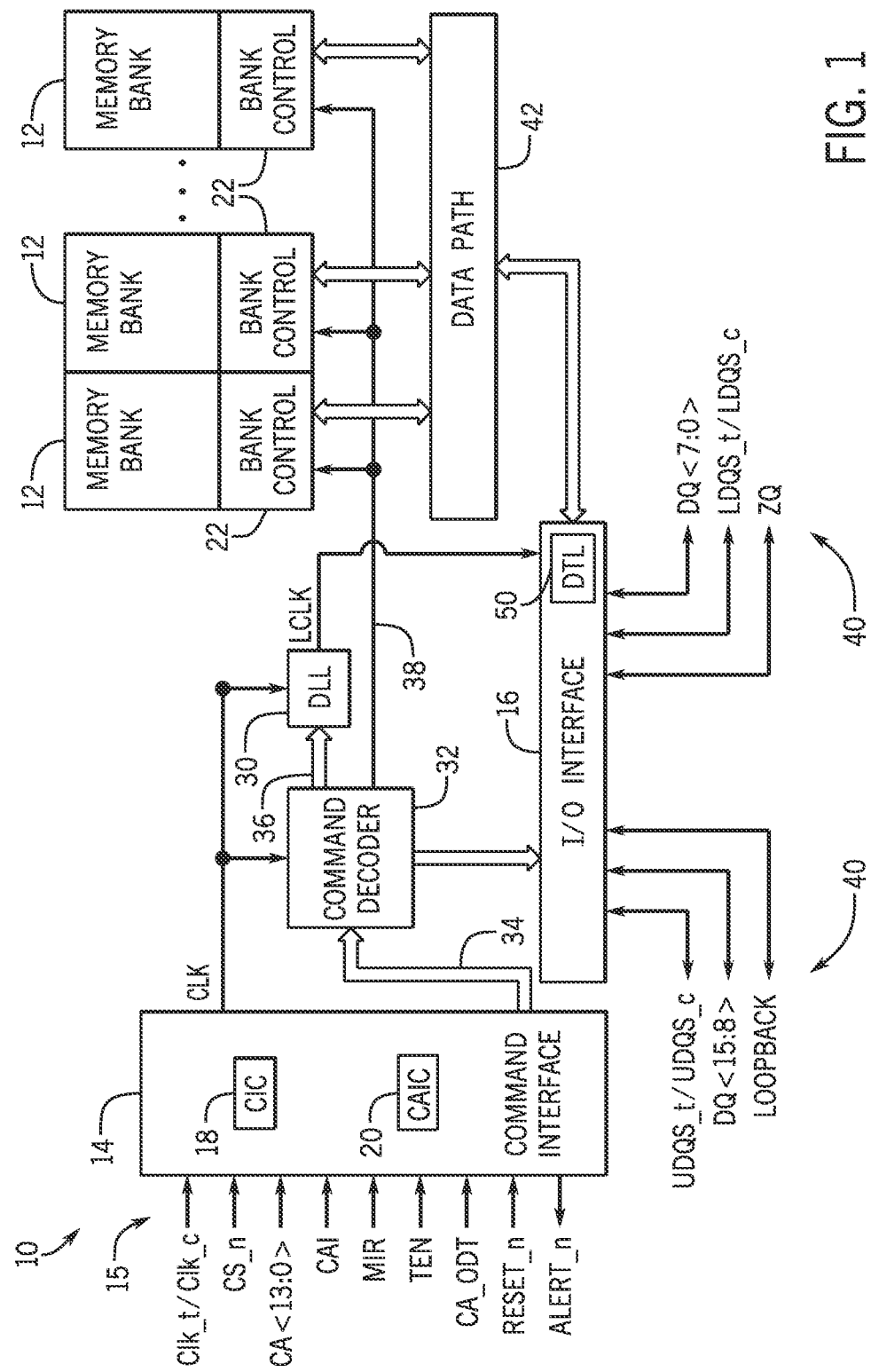
FIG. 1 is a simplified block diagram illustrating some features of a memory device having a dual-tail latch, according to an embodiment of the disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices receive signals having varying voltage levels during operation and may latch incoming signals within the receiver. Each signal may have a voltage level located in the common mode range, and each signal may be amplified to be processed in the memory device. To mitigate the need for additional electronic components (e.g., operational amplifiers), a dual-tail latch with one or more sensing stages, for comparing and amplifying input signals, and an output latch stage, that latches the output signals from the sensing stage, may be implemented with input transistors of each stage having a common transistor type (e.g., either n-type transistors or p-type transistors) employed as input transistors in each stage. As will be appreciated, dual-tail latches typically provides fast and reliable sense amplification by employing positive feedback through cross-coupled inverters in a sensing stage of the dual-tail latch.

However, due to timing constraints, semiconductor devices employ increasingly higher frequencies with tighter margins. Thus, the dual-tail latch may encounter difficulties in reliably sensing and latching inputs at higher frequencies. Embodiments disclosed herein provide systems for implementing an improved dual-tail latch with power gating circuits to improve regeneration time and reduce current flow when the dual-tail latch is not in use and thus, reduce current leakage and power consumption. More specifically, embodiments disclosed herein provide systems for implementing an improved dual-tail latch utilizing a second stage having power gating circuitry to improve regeneration time of the second stage. The improved regeneration time and low leakage characteristics may correspond to a larger eye opening, potentially resulting in greater signal fidelity using the improved second stage rather than the traditional second stage that does not include power gating circuitry. Embodiments disclosed herein provide systems for implementing an improved second stage within the dual-tail latch with power gating to increase the transconductance ($G_m$) through the second stage using additional p-type transistors (e.g., PMOS transistors). The p-type transistors are used to increase the voltage difference or voltage differential ($V_{diff}$) at the output nodes (Yp and Ym) of the second stage. The additional voltage differential $V_{diff}$ may correspond to faster latching of the output Zp of the third stage of the dual-tail latch. The disclosed dual-tail latch may also provide reduced loop time (margin) during DFE training using the improved second stage. Additionally, this improved second stage does not negatively impact the development time (e.g., setup and hold time and/or voltage) compared to conventional dual-tail latches. The improved regeneration time may provide an improvement in a rank margin tool (RMT) margin for the receiving data without adding additional power consumption due to no addition of current sources.

This low-power consumption may enable the improved second stage to add improvements over conventional dual-tail latches, while still being capable of being used in memory devices that use low-power modes/systems. Accordingly, the second stage may be easily adapted/used in any memory applications, such low-power double-data rate devices (such as LPDDR4 or LPDDR5 devices), high bandwidth memory (HBM) devices, and/or other systems that may use sensing and latching systems (e.g., the dual-tail latch). The improved voltage difference may also overcome any potential performance degradation without necessitating extensive changes to existing devices. Specifically, the improved second stage may be implemented by adding transistors to the conventional second stage of the dual-tail latch, as described in detail below.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device 10, such as decoding, timing control, data control, and any combination thereof.

A command interface 14 of the memory device 10 is configured to receive and transmit a number of signals (e.g., signals 15). The signals 15 may be received from an external device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). A positive clock edge for DDR refers to the point where a rising true clock signal Clk_t crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 18 receives the true clock signal (Clk_t) and the bar clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to an I/O interface 16, for instance, and is used as a timing signal for determining an output timing of read data. In some embodiments, as discussed below, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode incoming commands, such as read commands, write commands, mode-register set commands, activate commands, etc., and provide access to a particular memory bank 12 corresponding to the command via the bus path 38. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus 34 may be a 14-bit bus to accommodate the command/address signals (CA<13:0>). The command/address signals 15 are clocked to the command interface 14 using the clock signals (Clk_t and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 34, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 40 through the I/O interface 16. More specifically, the data may be sent to or retrieved from the memory banks 12 over a datapath 42, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c, LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description.

As discussed above, the memory device 10 may receive input signals at the I/O interface 16 to execute one or more commands. Before execution of the one or more commands based on the input signals, the memory device 10 may latch the input signals in the I/O interface 16. To latch the input signals, the memory device 10 may use a dual-tail latch 50 to sense/amplify and latch the input signals without the addition of other additional electronic components, as described in detail below.

Figure 2:
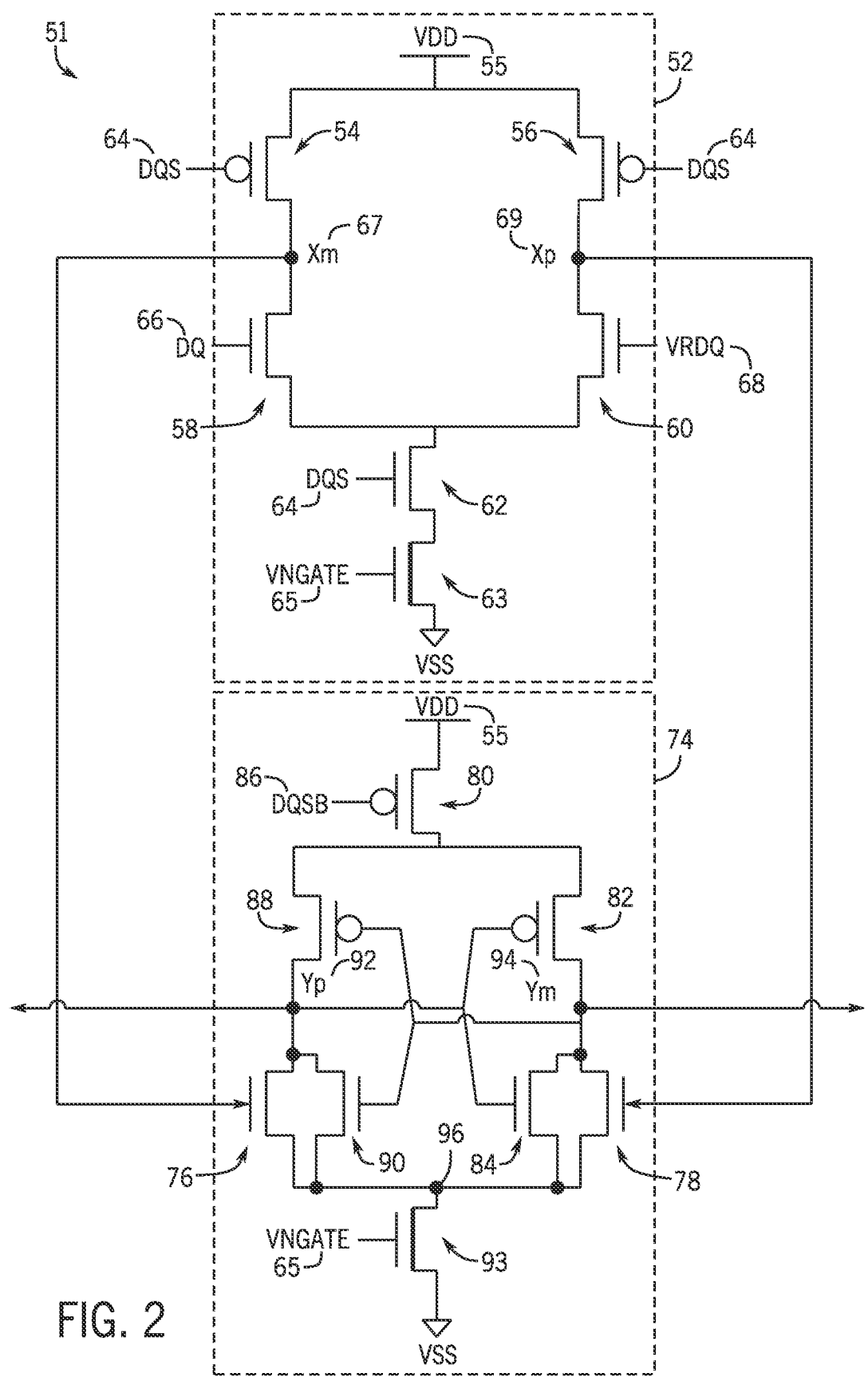
FIG. 2 is a circuit diagram of first and second stages of the dual-tail latch of FIG. 1, according to an embodiment of the disclosure.

With the foregoing in mind, FIG. 2 is a circuit diagram of the sensing and comparison stage 51 of the dual-tail latch 50 with n-type input transistors. As previously noted, the dual-tail latch 50 may be located in the I/O interface 16 in the memory device 10, for instance. The dual-tail latch 50 may include multiple stages for sensing and comparing input signals. As illustrated, the sensing and comparison stage 51 of the dual-tail latch 50 includes a first stage 52 for pre-charging and second stage 74 for sensing and amplifying a voltage difference. The first stage 52 includes transistors (e.g., MOSFET transistors) 54, 56, 58, 60, and 62. The transistors of the first stage 52 (i.e., transistors 54, 56, 58, 60, and 62) may be low threshold voltage (LVT) or normal threshold voltage (NVT) transistors. The input transistors 58 and 60 and the transistor 62 may be n-type transistors. Furthermore, the transistors 54 and 56 may be p-type transistors. In addition, the first stage 52 may include a high threshold voltage (HVT) transistor 63 to act as a switch to shut power off and reduce leakage when the first stage 52 is in an idle state (i.e., when the clock (DQS) signal is low).

The HVT transistor 63 may be activated and deactivated by a control signal (VNGATE) 65.

A DQS input signal 64 (e.g., UDQS_t/LDQS_t) may be connected to a gate of the transistors 54, 56, and 62 to clock the signals received by the transistors 58 and 60 to sense and amplify one or more signals at the first stage 52. For instance, a DQ input signal 66 (e.g., DQ<15:8>/DQ<7:0>) may be connected to a gate of the transistor 58. A voltage reference (VRDQ) 68 may be connected to a gate of the transistor 60. Additionally, voltage source (VDD) 55 may be coupled to a source of the transistors 54 and 56. A total current flowing through the transistor 62 is equal to a first current flowing through the transistor 54 and the transistor 58 through an output node Xm 67 of the first stage 52 between them plus a second current flowing through the transistor 56 and the transistor 60 through an output node Xp 69 of the first stage 52. The voltage signals at output nodes Xm 67 and Xp 69 may be output from the first stage 52 to a second sensing stage 74 after being developed by the DQS input signal 64.

As illustrated, the second stage 74 includes transistors (e.g., MOSFET transistors) 76, 78, 80, 82, 84, 88, and 90. The transistors of the second stage 74 (i.e., transistors 76, 78, 80, 82, 84, 88, and 90) may be low threshold voltage (LVT) or normal threshold voltage (NVT) transistors. Transistors 76, 78, 84, and 90 may be n-type transistors. Furthermore, transistors 80, 82, and 88 may be p-type transistors. In addition, the second stage 74 may include a high threshold voltage (HVT) transistor 93 to act as a switch to shut power off and reduce leakage when the second stage 74 is in an idle or off state. The HVT transistor 93 may be activated and deactivated by the control signal (VNGATE) 65. A DQSB 86 may be an inverted data strobe signal (e.g., UDQS_c/LDQS_c) that is complimentary to the DQS input signal 64. DQSB 86 may be connected to a gate of the transistor 80. Additionally, VDD 55 may be coupled to a source of the transistor 80.

During operation, when the DQS input signal 64 is low, the transistor 62 is off and the voltage at nodes Xm 67 and Xp 69 is reset and pre-charged to be equivalent to VDD 55 through transistors 54 and 56, respectively. When the DQS input signal 64 transitions high, the transistors 54 and 56 are turned off, the voltages at nodes Xm 67 and Xp 69 discharge, and the transistors 58, 60, and 62 are turned on. The transistors 58 and 60 draw a differential current proportional to the potential difference between the voltage of the DQ input signal 66 and the voltage reference VRDQ 68. The differential current flow due to the discharge of voltage allows the differential voltage between the node Xm 67 and the node Xp 69 to increase (e.g., differential gain) relative to the differential voltage between the DQ input signal 66 voltage and the voltage reference VRDQ 68. That is, the differential voltage is amplified and discharges the voltages at nodes Xm 67 and Xp 69 to VSS. As the nodes Xm 67 and Xp 69 continue to discharge, the transistors 76 and 78 of the second stage 74 are switched on.

As the transistors 76 and 78 are switched on, a differential voltage between the transistors 76 and 78 increases and passes to the cross-coupled inverters (i.e., transistors 82, 84, 88, and 90) of the second stage 74. As will be appreciated, each cross-coupled inverter includes a pair of oppositely polarized transistors (i.e., a first inverter including PMOS transistor 82 and NMOS transistor 84 and a second inverter including PMOS transistor 88 and NMOS transistor 90). The cross-coupled inverters (i.e., transistors 82, 84, 88, and 90) form a regenerative circuit, creating a full rail (e.g., digital ready) output at the output nodes Yp 92 and Ym 94 of the second stage 74, representative of the amplified DQ input signal 66. After a reset phase when transistors 62 and 80 turn on, the voltage difference between output nodes Xm 67 and Xp 69 begins to drop and the voltage difference is passed to transistors 76 and 78. The voltage difference is then passed to the cross-coupled inverters (i.e., transistors 82, 84, 88, and 90) which begin to regenerate (i.e., enters the regeneration phase) the voltage difference once the common-mode voltage at nodes Xm 67 and Xp 69 is no longer high enough for transistors 76 and 78 to clamp the outputs to ground.

Thus, during the regeneration phase/mode when the DQS input signal is low, the voltage at the output nodes Ym 94 and Yp 92 of the second stage 74 are regenerated by the voltages of the output nodes Xm 67 and Xp 69 of the first stage 52, applied to the transistors 76 and 78. The regeneration of the circuit is based on the positive-feedback provided by the cross-coupled transistors (i.e., transistors 82, 84, 88 and 90) of the second stage 74. During the regeneration phase, each transistor 76, 78, 82, 84, 88 and 90 operates in saturation mode. As appreciated, the small signal transconductance ($g_m$) of each transistor 76, 78, 82, 84, 88 and 90 is the ratio of the respective drain current ($I_D$) to gate-source voltage ($V_{GS}$) or $g_m = I_D / V_{GS}$. With this in mind, a total transconductance ($G_m$) of the second stage 74 can be approximated by the following series of equations (1)-(3):

$$G_m = G_{m,N} + G_{m,P} \qquad (1)$$

$$G_{m,N} = G_{76} + G_{78} + G_{84} + G_{90} \qquad (2)$$

$$G_{m,P} = G_{82} + G_{88} \qquad (3)$$

where $G_{m,N}$ is the total transconductance of the n-channel transistors (76, 78, 84 and 90) coupled to the output nodes Ym and Yp in the second stage 74 and $G_{m,P}$ is the total transconductance of the p-channel transistors (82 and 88) coupled to the output nodes Ym and Yp, respectively, in the second stage 74.

Figure 4:
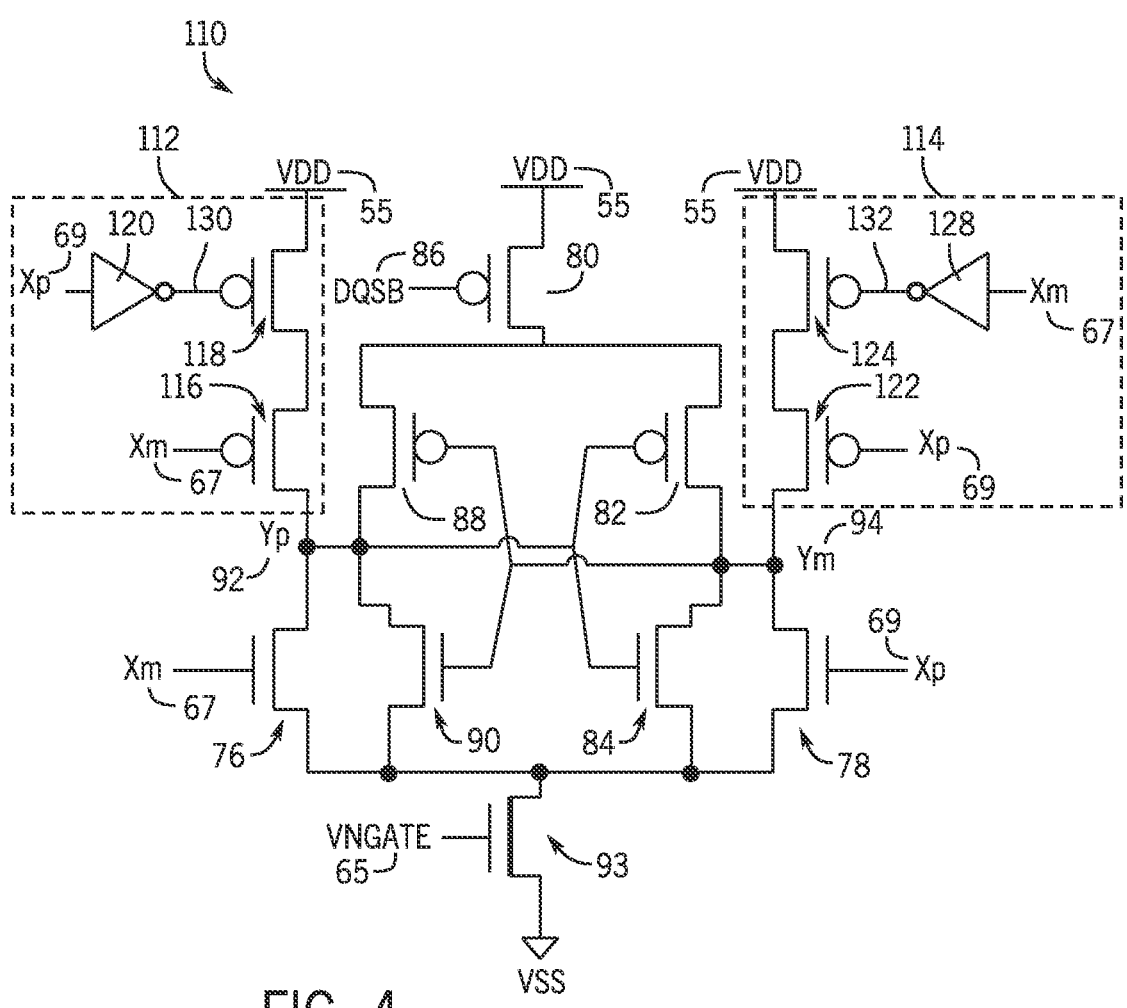
FIG. 4 is a circuit diagram of the second stage of the dual-tail latch of FIG. 2 having power gating circuitry, according to an embodiment of the disclosure.

During the regeneration mode the outputs Ym 94 and Yp 92 are being regenerated by the voltages supplied from outputs Xm 67 and Xp 69 of the first stage 52. The voltages at each node Xm 67, Xp 69, Yp 92 and Ym 94 become approximately equal to half of the voltage VDD 55 during regeneration. The transconductance of the n-channel transistors $G_{m,N}$ is relatively weak compared to the transconductance of the p-channel transistors $G_{m,P}$ due to the ground bounce voltage at the node 96, created by the latency when the HVT transistor 93 is turned on or off. The ground bounce voltage may be approximately 2 mV, for instance. As will be appreciated, during the sensing period, the differential voltage ($V_{diff}$) at the output nodes Ym 94 and Yp 92 and the associated regeneration time for the transistors in the second stage 74 can generally be described in accordance with the following equations (4) and (5):

$$V_{diff}(t) = V(0)e^{t/\tau_1} \qquad (4)$$

$$\tau_1 = \frac{C}{G_m - G_0} \cong \frac{C}{G_m} \qquad (5)$$

where V(0) is the initial voltage difference at the output nodes Ym 94 and Yp 92 at the start of regeneration, t is the total regeneration time (i.e., the time that the second stage 74 is in the regenerative mode), $\tau_1$ is the time coefficient, and C is the load capacitance at the output nodes Ym 94 and Yp 92. Thus, $\tau_1$ is equal to the load capacitance (C) of the second sensing stage 74 divided by the total transconductance ($G_m$) of the second sensing stage 74. The total sensing or regeneration time t decreases linearly with timing coefficient $\tau_1$ while only changing logarithmically with the initial voltage difference V(0). Thus, once a large enough voltage differential to override the offset is established on the output nodes Ym 94 and Yp 92, it may be advantageous to reduce the timing coefficient $\tau_1$ to decrease the regeneration time t and ensure proper operation, as will be discussed in further detail below with regard to FIG. 4.

Figure 3:
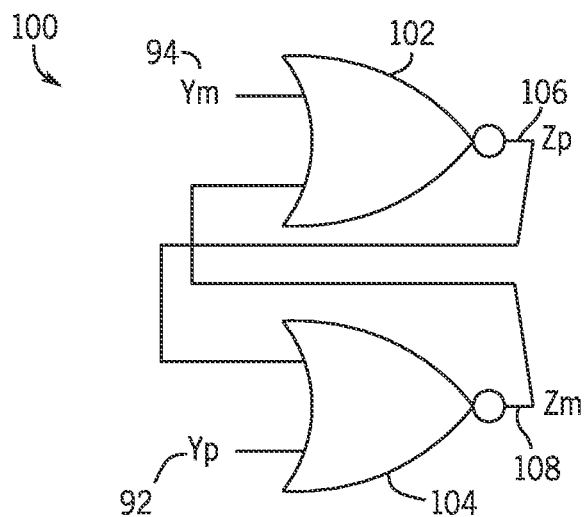
FIG. 3 is a circuit diagram of a third stage of the dual-tail latch of FIG. 1, according to an embodiment of the disclosure.

FIG. 3 shows a circuit diagram of an output stage 100 that includes an SR flip-flop for latching the output signals. The SR flip-flop may be implemented using NOR gates 102 and 104. The NOR gate 102 receives the signal from output node Ym 94 of the second stage 74 and outputs the signal Zp 106. The NOR gate 104 receives the signal from the output node Yp 92 of the second stage 74 and outputs the signal Zm 108. A critical timing point for the dual-tail latch 50, in terms of a data pattern, may be timing of the inversion of signals Zp 106 and Zm 108. As this timing point becomes tighter due to increased operating frequencies, improvements in the regeneration time of the second stage 74 may result in improvement in the efficiency and reliability of the dual-tail latch 50.

Accordingly, an improved second stage 110, having power gating circuitry to improve regeneration time is provided in accordance with the disclosed embodiments. The improved regeneration time and low leakage characteristics may correspond to a larger eye opening, potentially resulting in greater signal fidelity using the improved second stage 110 rather than the traditional second stage 74 that does not include power gating circuitry. More specifically, embodiments disclosed herein provide systems for implementing an improved second stage 110 within the dual-tail latch 50 with power gating circuits 112 and 114 to increase the transconductance ($G_m$) through the second stage 110 using additional p-type transistors (e.g., PMOS) 116 and 122 to decrease $\tau_1$. As described above, by reducing $\tau_1$, the voltage difference ($V_{diff}$) between output nodes Yp 92 and Ym 94 of the second stage 110 is increased. The additional voltage differential $V_{diff}$ may correspond to faster latching of the output Zp 106 of the third stage of the dual-tail latch 50. The disclosed dual-tail latch 50 utilizing the second stage 110 may also provide reduced loop time (margin) during DFE training using the improved second stage. Additionally, this improved second stage 110 does not negatively impact the development time (e.g., setup and hold time and/or voltage) in the dual-tail latch. The improved development time may provide an improvement in a rank margin tool (RMT) margin for the receiving data without adding additional power consumption due to no addition of current sources.

As illustrated, the power gating circuit 112 includes a PMOS transistor 116 coupled to the output node Yp 92 of the improved second stage 110. The PMOS transistor 116 and the NMOS transistor 76 are coupled in series at the common output node Yp 92 and each receive the voltage signal from the output node Xm 67. The power gating circuit 112 also includes a transistor 118 coupled to the transistor 116 to control the transistor 116 during the regeneration mode. The output signal Xp 69 is provided to the transistor 116 through an inverter 120 to ensure proper operation of the transistor 116. Similarly, the power gating circuit 114 includes a PMOS transistor 122 coupled to the output node Ym 94 of the improved second stage 110. The PMOS transistor 122 and the NMOS transistor 78 are coupled in series at the common output node Ym 94 and each receive the voltage signal from the output node Xp 69. The power gating circuit 114 also includes a transistor 124 coupled to the transistor 122 to control the transistor 122 during the regeneration mode. The output signal Xm 67 is provided to the transistor 116 through an inverter 120 to ensure proper operation of the transistor 116.

As discussed with regard to Equations (1)-(3), a total transconductance ($G_m$) of the second stage 110 can be approximated by the following series of equations:

$$G_m = G_{m,N} + G_{m,P} \quad \text{(Equation 1)}$$

$$G_{m,N} = G_{76} + G_{78} + G_{84} + G_{90} \quad \text{(Equation 2)}$$

$$G_{m,P} = G_{82} + G_{88} + G_{116} + G_{122} \quad \text{(Equation 6)}$$

where $G_{m,N}$ is the total transconductance of the n-channel transistors (76, 78, 84 and 90) coupled to the output nodes Ym 94 and Yp 92 in the second stage 74, and $G_{m,P}$ is the total transconductance of the p-channel transistors (82, 88, 116 and 122) coupled to the output nodes Ym 94 and Yp 92 in the second stage 110. Notably, with the addition of the PMOS transistors 116 and 122 coupled to the output nodes Ym 94 and Yp 92, the overall transconductance $G_m$ can be increased.

As discussed with reference to FIG. 2, during the regeneration mode, the transconductance of the n-channel transistors $G_{m,N}$ is relatively weak compared to the transconductance of the p-channel transistors $G_{m,P}$ due to the ground bounce voltage at the node 96, created by the latency when the HVT transistor 93 is turned on or off. Thus, by adding p-channel transistors coupled to the output nodes Ym 94 and Ym 92, the transconductance due to the p-channel transistors $G_{m,P}$ is increased significantly, thus increasing the total transconductance $G_m$ through the second stage 110. By increasing the transconductance $G_m$, $\tau_1$ is advantageously decreased and the voltage differential $V_{diff}$ between the output nodes Yp 92 and Ym 94 is advantageously increased.

More specifically, as the data strobe clock signal DQS transitions high, the voltage at nodes Xm 67 and Xp 69 transitions low. The transition from high to low of the voltage signals at nodes Xm 67 and Xp 69 represents the operating zone of the transistors 116 and 122, which should be kept as small as possible. The voltage at nodes 130 and 132 represent the timing delays associated with each inverter 120 and 128 which receive the voltage signals nodes Xp 69 and Xm 67, respectively. The transition of the voltages at nodes 130 and 132 activate the transistors 118 and 124 to control the transistors 116 and 122 during the regeneration mode.

By increasing transconductance $G_m$, by increasing the transconductance due to the p-channel transistors $G_{m,P}$, the voltage differential Vdiff between the output nodes Yp 92 and Ym 94 may significantly increase (e.g., by 100 mV or more). The increased voltage differential Vdiff may yield a faster latch time at the node Zp (e.g., approximately 15 picoseconds). Further, the voltage increased voltage differential Vdiff may correspond to a larger eye opening potentially resulting in greater signal fidelity using the second stage 110 rather than the first stage 74 (e.g., approximately 15 mV and 3 picoseconds) and an improvement in a rank margin tool (RMT) margin for the receiving data without adding additional power consumption due to no addition of current sources. This low-power consumption may enable improvements while still being capable of being used in memory devices that use low-power modes. Accordingly, the second stage 110 may be easily adapted/used in any memory applications, such low-power double-data rate devices (such as LPDDR4 or LPDDR5 devices), high bandwidth memory (HBM) devices, and/or other systems that may use sensing and latching systems (e.g., the dual-tail latch 50). The improved Vdiff may also overcome any potential performance degradation without making a large number of changes. Specifically, the second stage 110 may be implemented by simply adding power gating circuits 112 and 114, and particularly p-channel transistors 116 and 122 coupled to the output nodes Yp 92 and Ym 94 of the second stage 110.

While only certain features of the present disclosure have been illustrated and described herein, many modifications and changes will occur to those skilled in the art. For example, signal polarity for assertions may be inverted for at least some signals where a logic low is an assertion while a logic high is a de-assertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A semiconductor device, comprising:
a first sensing stage configured to sense a voltage differential of a data signal (DQ) and a reference signal (VRDQ) and output a first amplified voltage differential, wherein the first amplified voltage differential comprises a first voltage at a first output node and a second voltage at a second output node; and
a second sensing stage configured to sense the first amplified voltage differential and output a second amplified voltage differential, where the second amplified voltage differential comprises a third voltage at a third output node and a fourth voltage at a fourth output node;
wherein a first power gating circuit is coupled to the third output node and a second power gating circuit is coupled to the fourth output node;
wherein the first power gating circuit comprises a first p-channel transistor coupled to the third output node to increase transconductance at the third output node, and wherein the second power gating circuit comprises a second p-channel transistor coupled to the fourth output node to increase transconductance at the fourth output node;
wherein the second sensing stage comprises a first n-channel transistor coupled in series with the first p-channel transistor and to the third output node;
wherein the second sensing stage comprises a second n-channel transistor coupled in series with the second p-channel transistor and to the fourth output node;
wherein the gate of each of the of the first n-channel transistor and the first p-channel transistor receives the first voltage from the first output node; and
wherein the gate of each of the of the second n-channel transistor and the second p-channel transistor receives the second voltage from the second output node.

2. The semiconductor device of claim 1, wherein the semiconductor device comprises a dual-tail latch configured to output the second amplified voltage differential.

3. The semiconductor device of claim 1, wherein the second sensing stage comprises a cross-coupled inverter, wherein:
an output of a first inverter of the cross-coupled inverter is coupled to the third output node; and
an output of a second inverter of the cross-coupled inverter is coupled to the third output node.

4. The semiconductor device of claim 3, wherein:
the first inverter comprises a third p-channel transistor coupled in series with a third n-channel transistor at the third output node; and
the second inverter comprises a fourth p-channel transistor coupled in series with a fourth n-channel transistor at the fourth output node.

5. The semiconductor device of claim 1, wherein the first sensing stage comprises a first high voltage footer transistor arranged to couple the first sensing stage to ground (VSS) when a gate of the first high voltage footer transistor is open.

6. The semiconductor device of claim 5, wherein the second sensing stage comprises a second high voltage footer transistor arranged to couple the second sensing stage to ground (VSS) when a gate of the second high voltage footer transistor is open.

7. A semiconductor device comprising:
a first sensing stage configured to sense a voltage differential of a data signal (DQ) and a reference signal (VRDQ) and output a first amplified voltage differential, wherein the first amplified voltage differential comprises a first voltage at a first output node and a second voltage at a second output node; and
a second sensing stage configured to sense the first amplified voltage differential and output a second amplified voltage differential, where the second amplified voltage differential comprises a third voltage at a third output node and a fourth voltage at a fourth output node;
wherein a first power gating circuit is coupled to the third output node and a second power gating circuit is coupled to the fourth output node;
wherein the first power gating circuit comprises a first p-channel transistor coupled to the third output node to increase transconductance at the third output node, and wherein the second power gating circuit comprises a second p-channel transistor coupled to the fourth output node to increase transconductance at the fourth output node;
wherein the first power gating circuit comprises a third p-channel transistor coupled in series between the first p-channel transistor and a voltage source (VDD); and
wherein the second power gating circuit comprises a fourth p-channel transistor coupled in series between the second p-channel transistor and the voltage source (VDD).

8. The semiconductor device of claim 7, wherein:
the first power gating circuit comprises a first inverter configured to receive the second voltage from the second output node and to provide an input to the third p-channel transistor; and the second power gating circuit comprises a second inverter configured to receive the first voltage from the first output node and to provide an input to the fourth p-channel transistor.

9. A memory device, comprising:
a plurality of memory cells; and
an input/output (I/O) interface configured to receive a data signal (DQ) containing data for storage in the plurality of memory cells and to receive a data strobe signal (DQS) to aid in capturing the data signal (DQ), wherein the I/O interface comprises:
  a dual-sensing stage dual-tail latch, comprising:
    a first sensing stage configured to sense a differential between the data signal (DQ) and a reference signal (VRDQ) and to provide a first differential output, wherein the first differential output is an amplification of the differential between the data signal (DQ) and the reference signal (VRDQ);
    a second sensing stage configured to receive the first differential output and to provide a second differential output at output nodes, wherein the second differential output comprises an additional amplification of the differential between the data signal (DQ) and the reference signal (VRDQ) beyond the amplification in the first sensing stage, and wherein the second sensing stage comprises power gating circuitry configured to receive the first differential output and to provide the second differential output at the output nodes;
    an output stage configured to receive the second differential output, to latch the second differential output as a latched second differential output, and to provide a first latch output and a second latch output based on the latched second differential output.

10. The memory device of claim 9, wherein the memory device comprises one of a double data rate type five synchronous dynamic random access memory (DDR5 SDRAM) device, a low-power double-data rate type 4 (LPDDR4) device, a low-power double-data rate type 5 (LPDDR5) device or a high bandwidth memory (HBM) device.

11. The memory device of claim 9, wherein the second sensing stage comprises:
a cross-coupled inverter pair configured to output the second differential output between a first output node of the output nodes and a second output node of the output nodes;
a first n-channel transistor coupled to the first output node and configured to receive a first voltage signal corresponding to the first differential output; and
wherein a first power gating circuit of the power gating circuitry comprises a first p-type transistor coupled to the first output node, coupled in series with the first n-channel transistor, and configured to receive the first voltage signal corresponding to the first differential output.

12. The memory device of claim 11, wherein the second sensing stage comprises:
a second n-channel transistor coupled to the second output node and configured to receive a second voltage signal corresponding to the first differential output; and
wherein a second power gating circuit of the power gating circuitry comprises a second p-type transistor coupled to the second output node, coupled in series with the second n-channel transistor, and configured to receive the second voltage signal corresponding to the first differential output.

13. The memory device of claim 12, wherein:
the first power gating circuit comprises a first inverter configured to receive the second voltage signal corresponding to the first differential output, and a transistor coupled between the first p-type transistor and a voltage source (VDD) and configured to receive an output from the first inverter; and
the second power gating circuit comprises a second inverter configured to receive the first voltage signal corresponding to the first differential output, and a transistor coupled between the second p-type transistor and the voltage source (VDD) and configured to receive an output from the second inverter.

14. The memory device of claim 9, wherein the output stage comprises an SR flip-flop.

15. A memory device, comprising:
a first sensing stage configured to output a first voltage differential between a first output node and a second output node;
a second sensing stage comprising:
  a first p-type transistor configured to receive a first voltage from the first output node;
  a first n-type transistor configured to receive the first voltage from the first output node, wherein the first n-type transistor is coupled in series with the first p-type transistor at a third output node;
  a second p-type transistor configured to receive a second voltage from the second output node;
  a second n-type transistor configured to receive the second voltage from the second output node, wherein the second n-type transistor is coupled in series with the second p-type transistor at a fourth output node; and
  a cross-coupled inverter pair configured to output a second voltage differential between the third output node and the fourth output node; and
an output stage configured to receive and latch the second voltage differential from the third output node and fourth output node to a fifth output node and a sixth output node.

16. The memory device of claim 15, comprising:
a plurality of memory cells; and
an input/output (I/O) interface configured to receive a data signal (DQ) containing data for storage in the plurality of memory cells and to receive a data strobe signal (DQS) to aid in capturing the data signal (DQ), wherein the I/O interface comprises a dual-sensing stage dual-tail latch comprising each of the first sensing stage, the second sensing stage and the output stage, and wherein the first voltage differential corresponds to the data signal (DQ) and a reference signal (VRDQ).

17. The memory device of claim 15, wherein:
the first sensing stage comprises a first high voltage footer transistor arranged to couple the first sensing stage to ground (VSS) when a gate of the first high voltage footer transistor is open; and
the second sensing stage comprises a second high voltage footer transistor arranged to couple the second sensing stage to ground (VSS) when a gate of the second high voltage footer transistor is open.

18. The memory device of claim 15, comprising:
a first power gating circuit comprising a first inverter configured to receive the second voltage from the second output node, and a third p-type transistor coupled between the first p-type transistor and a voltage source (VDD) and configured to receive an output from the first inverter; and a second power gating circuit comprises a second inverter configured to receive the first voltage from the first output node, and a fourth p-type transistor coupled between the second p-type transistor and the voltage source (VDD) and configured to receive an output from the second inverter.

* * * * *